US008884169B2

(12) United States Patent
Jozwiak

(10) Patent No.: US 8,884,169 B2
(45) Date of Patent: Nov. 11, 2014

(54) CIRCUIT ASSEMBLY

(75) Inventor: Andrew J. Jozwiak, El Paso, TX (US)

(73) Assignee: Delphi Technologies, Inc., Troy, MI (US)

( * ) Notice: Subject to any disclaimer, the term of this patent is extended or adjusted under 35 U.S.C. 154(b) by 242 days.

(21) Appl. No.: 13/539,553

(22) Filed: Jul. 2, 2012

(65) Prior Publication Data
US 2014/0000958 A1   Jan. 2, 2014

(51) Int. Cl.
H01B 5/00 (2006.01)
H05K 7/02 (2006.01)

(52) U.S. Cl.
CPC ... H01B 5/00 (2013.01); H05K 7/02 (2013.01)
USPC ........................ 174/536; 174/126.1

(58) Field of Classification Search
CPC .............. H01B 5/00; H01B 1/00; H05K 7/02; H05K 3/0061; H05K 3/202; H05K 3/306; H05K 1/021; H05K 2201/09663; H05K 2201/0969; H05K 2201/1059
USPC .............................................. 174/536, 126.1
See application file for complete search history.

(56) References Cited

U.S. PATENT DOCUMENTS

| 4,804,332 | A | 2/1989 | Pirc |
| 4,890,152 | A | 12/1989 | Hirata et al. |
| 5,745,347 | A | 4/1998 | Miller et al. |
| 6,144,571 | A | 11/2000 | Sasaki et al. |
| 6,188,019 | B1 | 2/2001 | Baur et al. |
| 6,280,253 | B1 | 8/2001 | Kraus et al. |
| 8,067,778 | B2 * | 11/2011 | Bae et al. ........................ 257/98 |
| 2003/0203539 | A1 | 10/2003 | Islam et al. |
| 2009/0127677 | A1 | 5/2009 | Gomez |

OTHER PUBLICATIONS

International Search Report dated Oct. 18, 2013.

* cited by examiner

Primary Examiner — Timothy Thompson
Assistant Examiner — Charles Pizzuto
(74) Attorney, Agent, or Firm — Lawrence D. Hazelton

(57) ABSTRACT

A circuit assembly that includes a planar lead frame formed of electrically conductive material having a first thickness. The lead frame is configured to define a routing plane and a plurality of coplanar sections in the routing plane. The circuit assembly also includes a top-side terminal formed of electrically conductive material having a second thickness independent of the first thickness. The top-side terminal is configured to be inserted into a hole defined in a section and form an electrical connection to the section, wherein the top-side terminal protrudes from the routing plane.

4 Claims, 3 Drawing Sheets

CIRCUIT ASSEMBLY

TECHNICAL FIELD OF INVENTION

This disclosure generally relates to circuit assemblies, and more particularly relates to a circuit assembly using a stamped metal lead frame with terminals inserted into holes in the lead frame.

BACKGROUND OF INVENTION

Three-dimensional lead frames that form terminals from a two dimensional stamping by bending up or down portions of the stamping are known. Typically, the thickness requirements for the vertically oriented terminals are greater than the thickness requirement for the horizontally oriented routing plane, and so the routing plane is unnecessarily thick. Furthermore, a three-dimensional lead frame typically requires multiple stamping and forming dies, and so the tooling costs associated with three-dimensional lead frames is undesirable high.

SUMMARY OF THE INVENTION

In accordance with one embodiment, a circuit assembly is provided. The assembly includes a planar lead frame and a top-side terminal. The planar lead frame is formed of electrically conductive material having a first thickness. The lead frame is configured to define a routing plane and a plurality of coplanar sections in the routing plane. The top-side terminal is formed of electrically conductive material having a second thickness independent of the first thickness. The top-side terminal is configured to be inserted into a hole defined in a section and form an electrical connection to the section. The top-side terminal protrudes from the routing plane.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
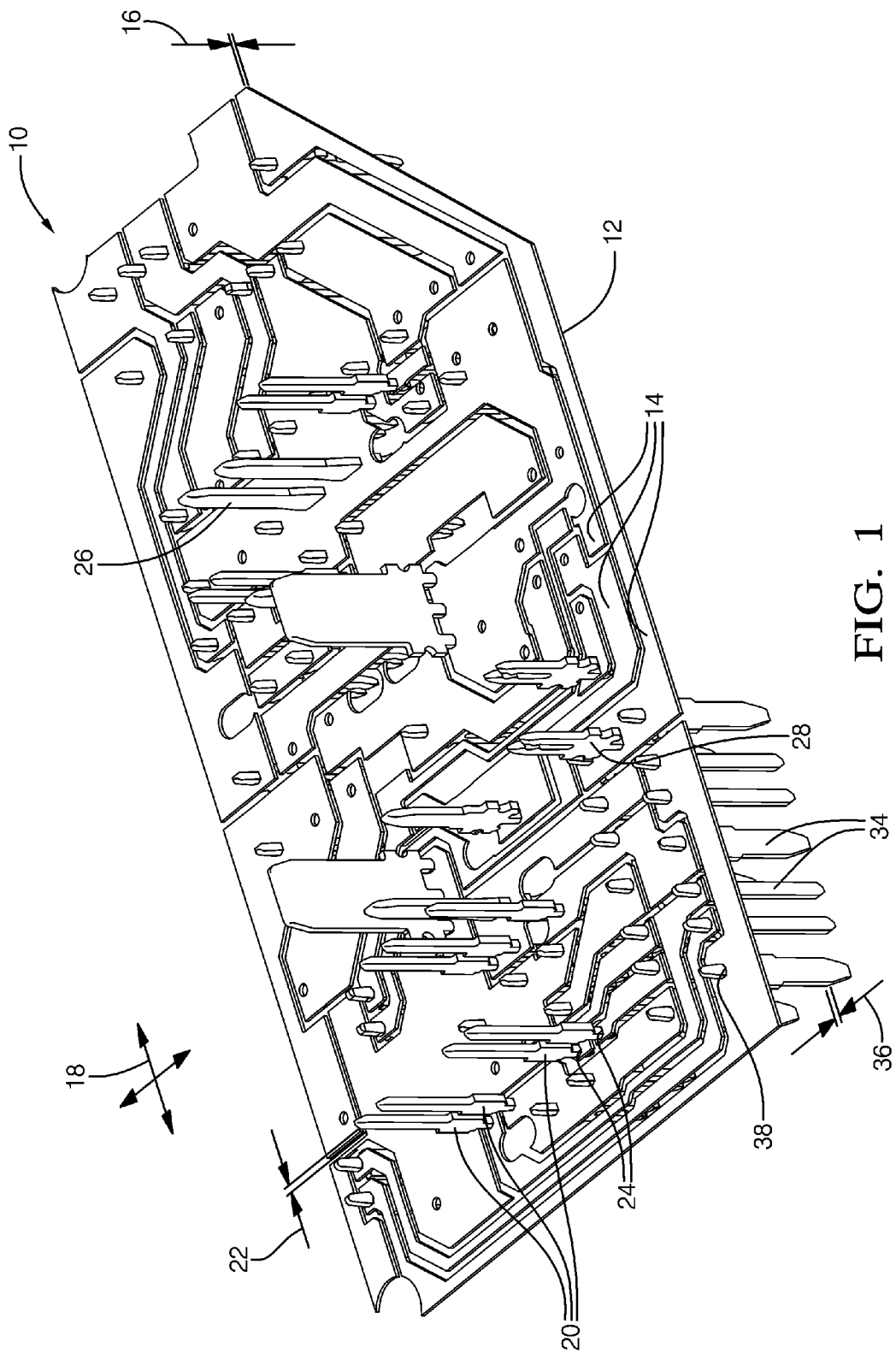
FIG. 1 is a perspective view of a circuit assembly in accordance with one embodiment.

FIG. 1 illustrates a non-limiting example of a circuit assembly, hereafter the assembly 10. The assembly 10 includes a lead frame 12 that is characterized as being planar. The lead frame 12 is typically formed from a sheet of electrically conductive material, for example, a copper alloy that may include plating layers on the surface of the sheet to reduce corrosion or facilitate subsequent processing such as soldering. The sheet is further processed to form various sections 14 by any of a number of known techniques such as stamping or die cutting, mechanical machining, laser or water-jet cutting, or photo-etching. The sheet may be characterized as having a first thickness 16 that is selected based on, but not limited to, current carrying requirements of the sections 14, and any subsequent processing of the lead frame 12. The lead frame 12 is generally handled and packaged so that the sections 14 are coplanar, and so define a routing plane 18 that corresponds to the plane of the lead frame 12.

Electrical connections to any of the sections 14 may be by way of a top-side terminal 20 attached to one of the sections 14. In general, the top-side terminal 20 is formed of electrically conductive material having a second thickness 22 independent of the first thickness of the lead frame 12. The composition of material used for the top-side terminal may be the same or different than the composition of material used for the lead frame 12. Typically the second thickness 22 of the top-side terminal 20 will be greater than the first thickness 16 as the top-side terminal 20 is expected to need more structural strength than the lead frame 12, and so the top side terminal thickness corresponds to mating terminal requirements. The top-side terminal 20 may be formed using machining techniques known for forming such terminals including stamping and coining. In general, the top-side terminal 20 is configured to be inserted into a hole 24 defined in one of the sections 14. As used herein, the hole may be round, oval, square, rectangle, a slot, or any shape opening suitable for receiving the top-side terminal 20. The top-side terminal 20 is also generally configured to form an electrical connection to the section having the hole 24 into which the top-side terminal 20 is inserted. After the top-side terminal 20 is inserted into the hole 24, it may be characterized as protruding from the routing plane 18.

The top-side terminal 20 may be formed to serve as a connector terminal 26 for making a subsequent connection to a mating connector (not shown). Alternatively, the top-side terminal 20 may be formed to serve as a component lead fork 28 for receiving and securing a leaded electrical component (not shown) such as a fuse, a relay, a resistor or a capacitor. Alternatively, the leaded electrical component could be soldered to holes 24 in the lead frame 12.

The top-side terminal 20 is preferably attached to the section 14 by way of forced insertion or mechanical interference fitting so that the top-side terminal 20 is fixedly oriented for any subsequent processing. Subsequent processing may include soldering or welding of the top-side terminal 20 to the section 14, welding. Alternatively, the top-side terminal 20 may be loosely placed into the hole 24, and held in place by fixture (not shown) and then subsequently secured to and electrically connected to the section 14 by welding (e.g. laser welding) or soldering.

Figure 2:
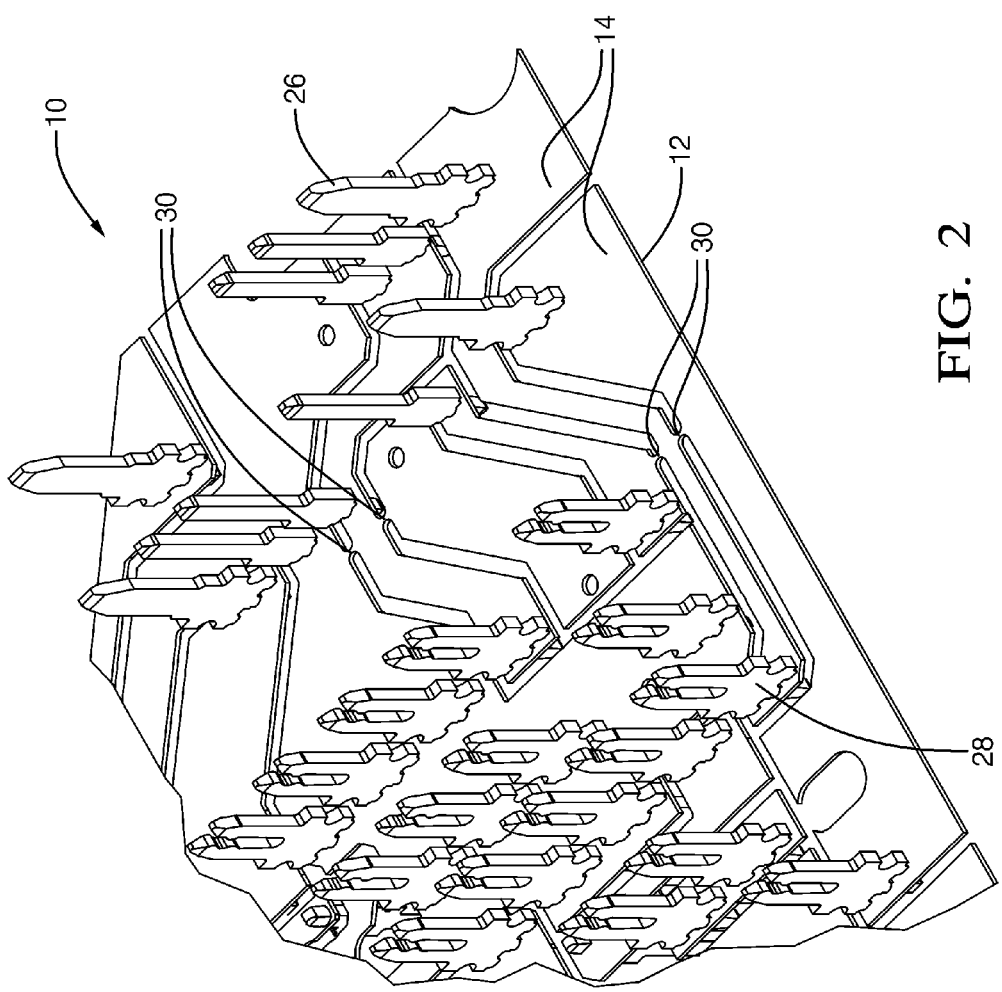
FIG. 2 is a close-up perspective view of the circuit assembly of FIG. 1 in accordance with one embodiment.
Figure 3:
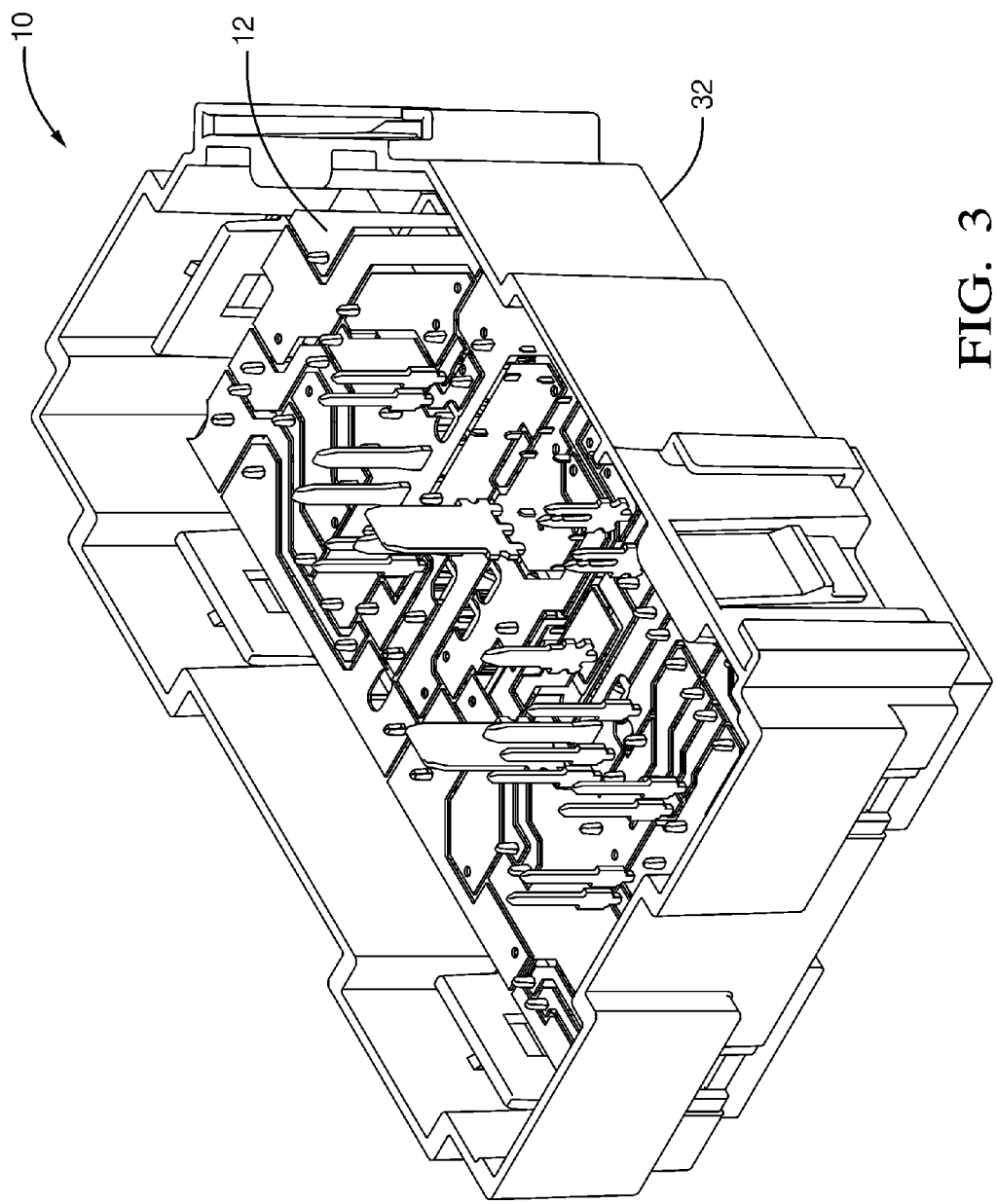
FIG. 3 is a perspective view of the circuit assembly of FIG. 1 that includes a housing in accordance with one embodiment.

FIG. 2 illustrates a non-limiting example of the lead frame 12 that includes webs 30 that interconnect the sections 14 of the lead frame 12 prior to inserting the top-side terminal 20. It is recognized that FIG. 1 appear to suggest that the sections 14 are somehow miraculously suspended in space, but this only for the purpose of simplifying the illustration. The webs 30 help hold the section 14 coplanar while the lead frame 12 is being fabricated, and the top-side terminal 20 is being installed. Then after the various terminals are installed, the lead frame 12 with the terminals may be installed into a housing 32 (FIG. 3). In general, the housing 32 is configured to receive and support the lead frame 12. Typically, after the lead frame 12 is installed into the housing 33, the webs 30 are removed by any of several known techniques such as cutting or shearing.

Referring again to FIG. 1, the assembly 10 may also include a bottom-side terminal 34 so, for example, electrical connectors or electrical components can be located on both sides of the lead frame 12. Like the top-side terminal 20, the bottom-side terminal 34 may be formed of electrically conductive material having third thickness 36 independent of the first thickness 16 and the second thickness 22. It should be recognized that each of the terminals on either side of the lead frame 12 may be made of different materials with different thickness so that each terminal is optimized for material composition and thickness. Like the top-side terminal 20, the bottom-side terminal 34 is configured to be inserted into another hole 38 defined in a section 14 of the lead frame 12 from the opposite side as the top-side terminal 20. It follows that the bottom-side terminal 34 forms an electrical connection to the section 14 so that the bottom-side terminal 34 protrudes from the routing plane 18 in a direction opposite that of the top-side terminal 20. It is also contemplated that the bottom-side terminal 34 may be coupled to the lead frame 12 using any technique including, but not necessarily the same, and those described above with regard to the top-side terminal 20

Accordingly, a circuit assembly (the assembly 10) is provided. In one embodiment, the assembly 10 defines a flat plane (i.e. the routing plane) of material that is stamped to form sections 14 within the routing layer with connections terminals inserted or stitched into the lead frame 12. The stitched connections can be fixed by soldering, welding, or direct mechanical interference fit. Since there lead frame 12 does not use folded sections to form a three-dimensional lead frame, the percentage utilization of material is relatively high. Material thickness for the lead frame 12 can be optimized based on current carry capacity and not on standard terminal connection systems. The terminals (20, 34) that are stitched into the sections 14 may be a standard thickness for the terminals. The sections 14 may be supported by plastic insulating layers, upper or lower housings (32), or attached to a printed circuit board (PCB) to allow for more complicated routing, electronics, or PCB mounted relays. Layer to layer connections or multilayer connectivity can be made through the same features. It is contemplated that PCB attachment would typically only be for more complex routing and electronics. However, it is recognized that leaded PCB components such as PCB relays could still be soldered to lead frame 12.

While this invention has been described in terms of the preferred embodiments thereof, it is not intended to be so limited, but rather only to the extent set forth in the claims that follow.

I claim:

1. A circuit assembly comprising:
   a planar lead frame formed of electrically conductive material having a first thickness, said lead frame configured to define a routing plane and a plurality of coplanar sections in the routing plane;
   a top-side terminal formed of electrically conductive material having a second thickness independent of the first thickness, said top-side terminal configured to be inserted into a hole defined in a section and form an electrical connection to the section, wherein the top-side terminal protrudes from the routing plane, wherein said top-side terminal is characterized as one of a connector terminal and a component lead fork.

2. The assembly in accordance with claim 1, wherein said top-side terminal is attached to the section by way of one or more of soldering, welding, and mechanical interference fitting.

3. The assembly in accordance with claim 1, wherein said lead frame includes webs that interconnect sections of the lead frame prior to inserting the top-side terminal, said assembly further comprises a housing configured to receive the lead frame, and said webs are removed after the lead frame is installed into a housing.

4. The assembly in accordance with claim 1, wherein said assembly further comprises a bottom-side terminal formed of electrically conductive material having third thickness independent of the first thickness and the second thickness, said bottom-side terminal configured to be inserted into another hole defined in a section of the lead frame from the opposite side as the top-side terminal, and form an electrical connection to the section that protrudes from the routing plane in a direction opposite that of the top-side terminal.

* * * * *